United States Patent
Ferro et al.

(10) Patent No.: US 6,242,718 B1
(45) Date of Patent: Jun. 5, 2001

(54) WAFER HOLDER

(75) Inventors: Armand Ferro, Phoenix, AZ (US); Ivo Raaijmakers, Bilthoven (NL); Ravinder Aggarwal, Gilbert, AZ (US); Ronald R. Stevens, San Ramon, CA (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/434,030

(22) Filed: Nov. 4, 1999

(51) Int. Cl.[7] ...................................................... A21B 1/00
(52) U.S. Cl. ..................... 219/405; 118/724; 118/500; 269/20; 414/935
(58) Field of Search ..................................... 219/390, 405, 219/411; 392/416, 418; 118/500, 724, 725, 728, 729, 50.1; 269/20, 46; 414/935, 936, 941

(56) References Cited

U.S. PATENT DOCUMENTS 5,080,549 * 1/1992 Goodwin et al. .................. 414/744.8
6,072,157 * 6/2000 Klebanoff et al. .................. 219/228

\* cited by examiner

Primary Examiner—Teresa Walberg
Assistant Examiner—Shawntina Fuqua
(74) Attorney, Agent, or Firm—Knobbe, Martens, Olson & Bear, LLP

(57) ABSTRACT

A Bernoulli wand type semiconductor wafer pickup device that is adapted to regulate the temperature of a wafer while the wafer is being repositioned within a semiconductor processing system. In one embodiment, the device is comprised of a resistive heating element that is adapted to raise the temperature of the pickup device. In particular, by raising the temperature of the pickup device, a portion of the thermal radiation emitted from the device is absorbed by the wafer, thus providing a means for regulating the wafer temperature. In another embodiment, the device is adapted with the characteristics of a black body absorber so as to enable the device to optimally absorb thermal radiation from external radiant sources, thereby providing a means for increasing the temperature of the device. In another embodiment, the device is coated with reflective material that enables a large portion of thermal radiation emitted from the wafer to be reflected and absorbed back into the wafer. In another embodiment, the preexisting gas system of the pickup device is adapted with a gas beating device that is adapted to raise the temperature of the gas so as to regulate the temperature of the wafer.

16 Claims, 6 Drawing Sheets

WAFER HOLDER

BACKGROUND OF THE INVENTION

1. Field of the Invention

The present invention relates to semiconductor substrate handling systems and in particular relates to semiconductor substrate pickup devices employing gas flow to lift a wafer in a substantially non-contacting manner.

2. Description of the Related Art

Integrated circuits are typically comprised of many semiconductor devices, such as transistors and diodes, which are formed on a thin slice of semiconductor material, known as a wafer. Some of the processes used in the manufacturing of semiconductor devices in the wafer include an epitaxial process or a doping process that involves positioning the wafer in high temperature chambers where the wafer is exposed to high temperature gases which result in doped layers or regions being selectively formed in the wafer. When forming such integrated circuits, it is often necessary to remove the wafer from one high temperature chamber having a first doping or epitaxial species and reposition the hot wafer having a temperature as high as 1200 degrees Celsius to another high temperature chamber having a different doping or epitaxial species. However, since the wafer is extremely brittle and vulnerable to particulate contamination, great care must be taken so as to avoid physically damaging the wafer while it is being transported, especially when the wafer is in a heated state.

To avoid damaging the wafer during the transport process, various well known wafer pickup devices have been developed. The particular application or environment from which the wafer is lifted often determines the most effective type of pickup device. One class of pickup devices, known as Bernoulli wands, are especially well suited for transporting very hot wafers. The advantage provided by the Bernoulli wand is that the hot wafer generally does not contact the pickup wand, except perhaps at one or more small locators positioned on the underside of the wand. Such a Bernoulli wand is shown in U.S. Pat. No. 5,080,549 to Goodwin, et al.

In particular, when positioned above the wafer, the Bernoulli wand utilizes jets of gas to create a gas flow pattern above the wafer that causes the pressure immediately above the wafer to be less than the pressure immediately below the wafer. Consequently, the pressure imbalance causes the wafer to experience an upward "lift" force. Moreover, as the wafer is drawn upward toward the wand, the same jets that produce the lift force produce an increasingly larger repulsive force that prevents the wafer from substantially contacting the Bernoulli wand. As a result, it is possible to suspend the wafer below the wand in a substantially non-contacting manner. However, Bernoulli wands known in the art do not always operate in the most advantageous manner.

In particular, although heat conduction from the hot wafer to the Bernoulli wand is substantially minimized, other modes of heat loss from the wafer are likely. Specifically, the wafer emits thermal radiation or radiant heat, at a rate that is proportional to the fourth power of the temperature of the wafer. Furthermore, the moving gas at the upper surface of the wafer caused by the jets of gas emanating from the Bernoulli wand is likely to cause the wafer to experience significant convective heat loss. Moreover, since the spacing between the wafer and the wand is small, conduction through the gas is a third significant heat loss mechanism. Consequently, it is likely that the internal energy of the wafer will drop significantly while the wafer is moved by the wand between high temperature chambers, thus causing the temperature of the wafer to decrease significantly during the movement process.

The possible reduction in temperature of the wafer resulting from the movement of the substrate may be desirable when high temperature processing is complete but in many circumstances is undesirable. In particular, if significant cooling occurs during the movement process, additional time is required in the manufacturing process so as to allow the wafer to achieve a preferred target processing temperature when manipulated between high temperature chambers. Of even greater concern, however, is the possibility that the cooled wafer will deform and experience thermal shock when abruptly placed in a hot reactor or onto a hot body, thereby possibly damaging the wafer. Furthermore, when a cooled wafer is placed on a hot body such as a susceptor, it is possible for the susceptor to experience deleterious thermal shock, which can damage the susceptor.

From the foregoing, it will be appreciated that there is a need for a semiconductor wafer pickup device that enables a high temperature wafer to be transported within a semiconductor processing system in a manner to reduce the likelihood of damaging the wafer and sensitive components of the semiconductor processing system. To this end, there is a need for a pickup device that regulates the temperature of the wafer during the manipulation process.

SUMMARY OF THE INVENTION

The aforementioned needs are satisfied by the wand of the present invention having a head or forward portion that directs a flow of gas to cause the wafer to be lifted in a substantially non-contacting manner. A primary example of such a device is a so-called Bernoulli wand that produces a pressure differential between the upper surface of the wafer and a lower surface of the wafer that generates a lift force that causes the wafer to be suspended, spaced slightly below the head. The wand is further comprised of at least one thermal control device that regulates the temperature of the wafer while the wafer is engaged with the head so as to minimize heat loss and reduce the likelihood of the wafer experiencing thermal shock as the wafer is moved from a highly heated environment to a cooler one.

In another aspect of the invention, the aforementioned needs are satisfied by the semiconductor wafer transport system of the present invention having a gas supply that couples with the wand to enable the wand to produce a flow of gas along an upper surface of the wafer so as to produce a pressure differential between the upper surface of the wafer and a lower surface of the wafer. The wafer transport system is further comprised of a robotic arm that controllably moves the Bernoulli wand so as to enable movement of the engaged wafer. The wafer transport system is further comprised of at least one thermal energy source that regulates the temperature of the wafer while the wafer is engaged with the wand so as to reduce the likelihood of the wafer experiencing thermal shock.

In another aspect of the invention, the aforementioned needs are satisfied by the semiconductor wafer transport system for moving a semiconductor wafer from a first environment having a high temperature through a second environment having a low temperature into a third environment having a high temperature. In particular, the semiconductor wafer transport system is comprised of a gas supply assembly that supplies a flow of gas. The semiconductor wafer transport system is further comprised of a Bernoulli wand that couples with the gas supply assembly so that the flow of gas from the gas supply assembly can flow into the wand so as to enable the wand to engage with the wafer by producing a flow of gas along an upper surface of the wafer so as to produce a pressure differential between the upper surface of the wafer and a lower surface of the wafer. Furthermore, the pressure differential generates a lift force that supports the wafer below the Bernoulli wand in a substantially non-contacting manner. The semiconductor wafer transport system is further comprised of a robotic arm that controllably moves the Bernoulli wand so as to enable movement of the engaged wafer and at least one thermal energy source that regulates the temperature of the wafer while the wafer is engaged with the wand so as to reduce the likelihood of the wafer experiencing thermal shock.

In another aspect of the invention, the aforementioned needs are satisfied by the method of engaging a semiconductor wafer, the method comprising directing a flow of gas adjacent an upper surface of the wafer so as to create a pressure differential between the upper surface of the wafer and a lower surface of the wafer. In particular, the pressure differential generates a lift force that suspends the wafer in a substantially non-contacting manner. The method is further comprised of regulating the temperature of the wafer so as to reduce the likelihood of the wafer experiencing thermal shock.

In another aspect of the invention, the aforementioned needs are satisfied by the method of moving a semiconductor wafer in a semiconductor processing system, the method comprising engaging the wafer with a wand, wherein the wand is adapted to produce a flow of gas adjacent an upper surface of the wafer so as to produce a pressure differential so that an upward lift force is generated onto the wafer. The method is further comprised of moving the wand so as to move the wafer, thereby enabling the wafer to be processed in at least one heated chamber of the semiconductor processing system. The method is further comprised of regulating the temperature of the wafer while the wafer is engaged by the wand so as to inhibit the wafer from losing thermal energy so as to reduce the possibility of the wafer experiencing thermal shock when the wafer is positioned inside of the at least one heated chamber.

From the foregoing, it should be apparent that the wafer transport system and method of the present invention enables a semiconductor wafer to be moved in a more effective manner. In particular, wafer transport of the present invention is capable of regulating the temperature of the wafer so as to reduce the likelihood of the wafer experiencing thermal shock and resultant damage. These and other objects and advantages of the present invention will become more apparent from the following description taken in conjunction with the accompanying drawings.

DETAILED DESCRIPTION OF THE PREFERRED EMBODIMENT

Figure 1A:
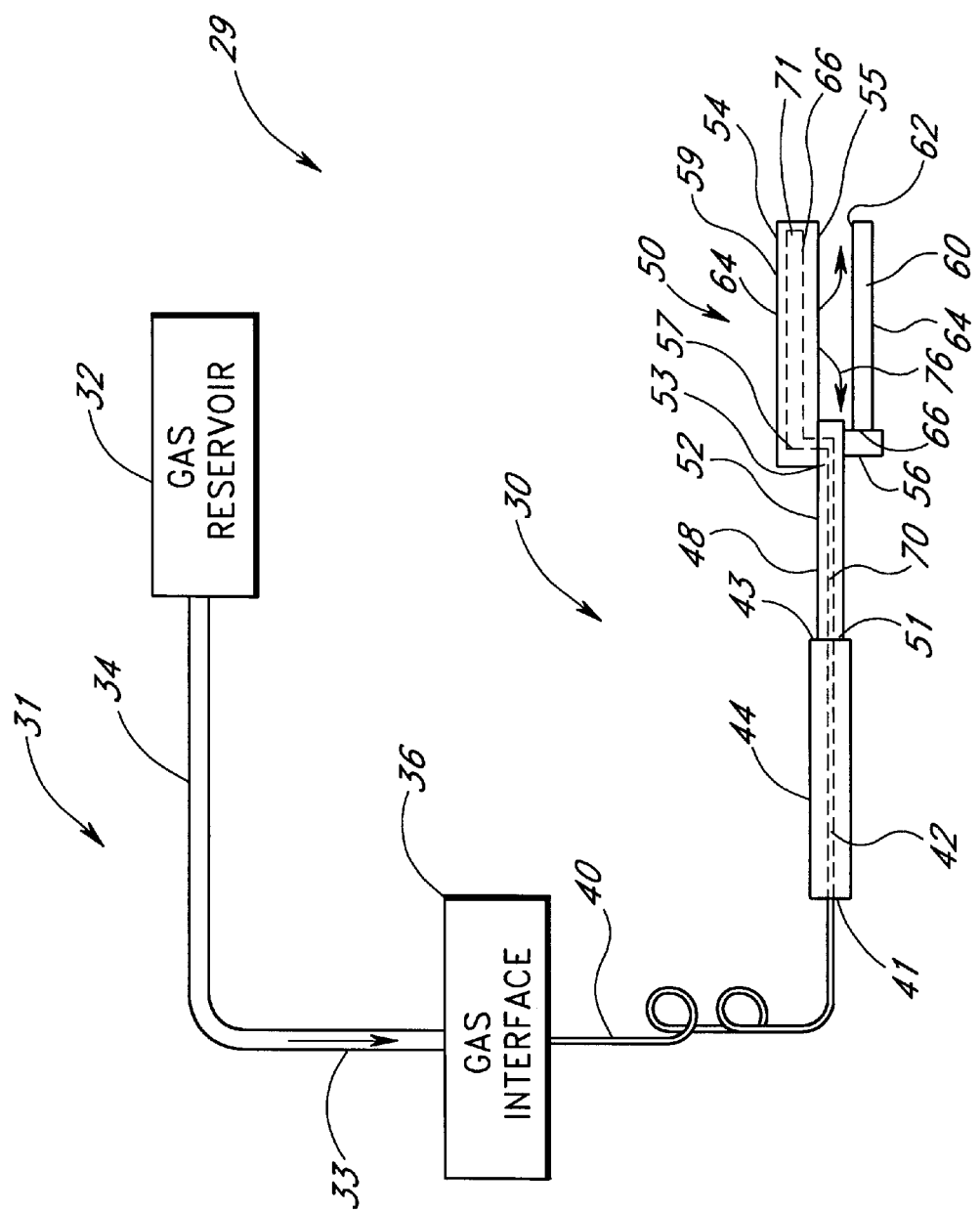
FIG. 1A schematically illustrates a typical prior art wafer transport system comprised of a Bernoulli wand that is adapted to engage with a semiconductor wafer.

Reference will now be made to the drawings wherein like numerals refer to like parts through out. FIG. 1A generally illustrates a prior art semiconductor wafer transport system 29 that is adapted to transport a substantially flat semiconductor wafer 60 between high temperature chambers. In particular, the system 29 is comprised of a wafer transport assembly 30 having a movable Bernoulli wand 50 that is adapted to engage with the wafer 60 so as to transport the wafer 60 in a substantially non-contacting manner. The system 29 is further comprised of a gas supply assembly 31 that is adapted to supply a flow of gas 33, such as nitrogen, to the wand 50.

As shown in FIG. 1A, the gas supply assembly 31 is typically comprised of a main gas reservoir 32 and a main gas conduit 34 connected thereto. In particular, the reservoir 32 includes an enclosed cavity that is adapted to store a large quantity of gas under a relatively high pressure and a pressure regulator so as to controllably deliver the flow of gas 33 through the conduit 34 for an extended period of time. The reservoir 32 is usually located in an environment having a relatively mild temperature of about 20–30 degrees Celsius. Consequently, the temperature of the gas 33 exiting the conduit is typically at or around 20–30 degrees Celsius.

As shown in FIG. 1A, the typical prior art wafer transport assembly 30 is comprised of a gas interface 36, a conduit 40, a robotic arm 44 having a generally rear end 41, a movable outer end 43, and an enclosed gas channel 42 formed therebetween. In particular, the gas interface 36 is adapted to couple with the hose 34 of the gas supply assembly 31 so as to enable the gas 33 to flow into the arm 44. Moreover, the outer end 43 of the robotic arm 44 is adapted to be controllably positioned so as to displace the Bernoulli wand 50 connected thereto in a controlled manner. The robotic arm assembly 44 is substantially similar to robotic arms of the prior art.

As shown in FIG. 1A, the Bernoulli wand 50 includes an elongated neck or rear portion 52, a forward portion or flat head 54, and a plurality of alignment feet 56. The neck 52 includes a first and a second end 51 and 53, an upper surface 48, and an enclosed central gas channel 70 that extends from the first end 51 to the second end 53. Furthermore, the first end 51 of the neck 52 is attached to the outer end 43 of the robotic arm 44 so as to allow the gas 33 to flow from the channel 42 in the robotic arm 44 into the central gas channel 70 in the neck 52 of the Bernoulli wand 50. Additionally, the second end 53 of the neck 52 of the Bernoulli wand 50 is attached to the head 54 of the wand 50 so as to physically support the head 54 and so as to allow the gas 33 to flow from the central gas channel 70 into the head 54.

Figure 1B:
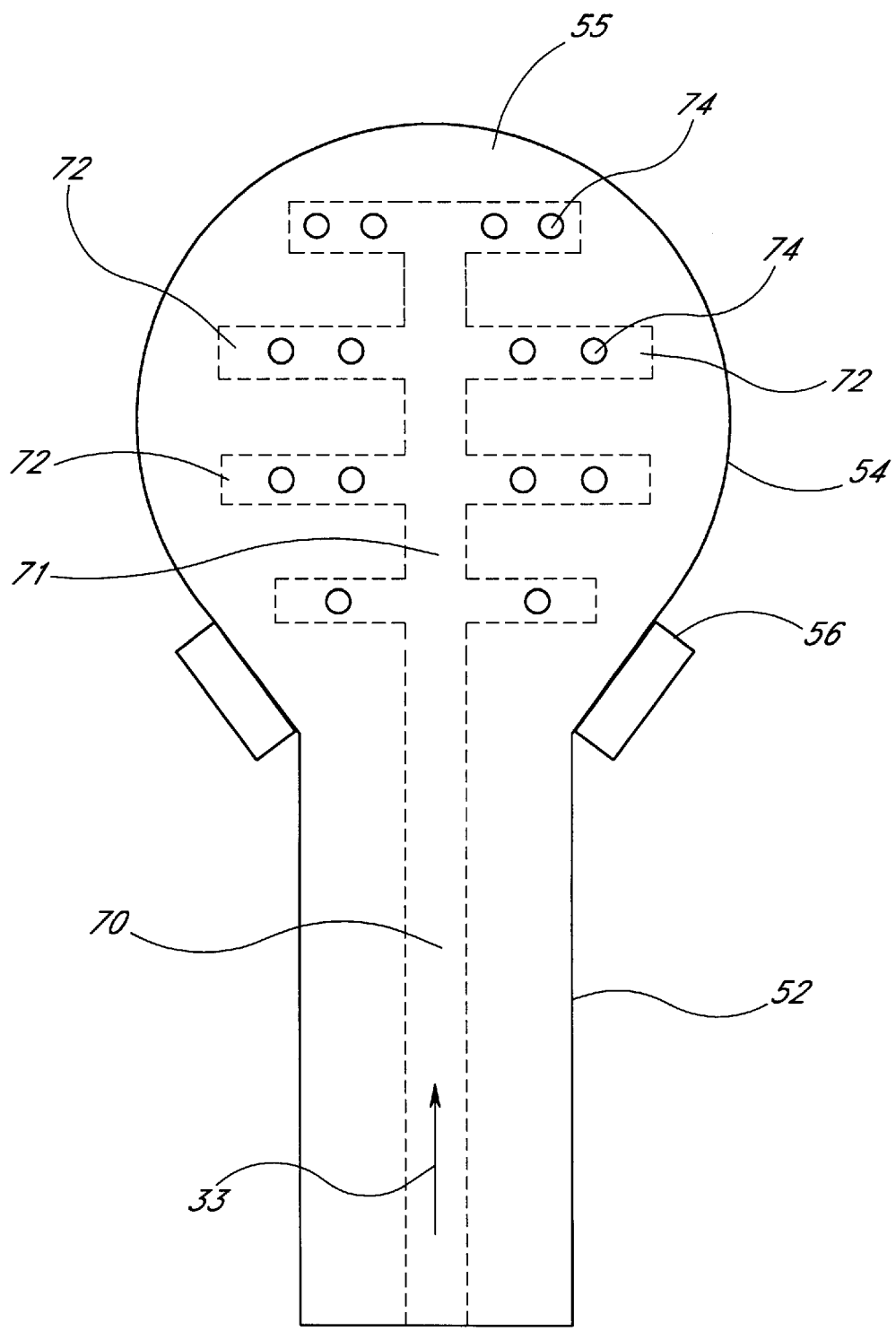
FIG. 1B is an underside plan view of the Bernoulli wand of FIG. 1A.

As shown in FIGS. 1A and 1B, the head 54 is formed of a substantially flat upper wall 64 and a substantially flat lower wall 66 that are combined in a parallel manner to form a composite structure having a first end 57, a lower surface 55, and an upper surface 59. Furthermore, the head 54 is supported by the neck 52 and further adapted so as to permit the gas 33 to flow to a plurality of gas outlet holes 74 that are located on the lower surface 55 of the head 54 as will be described below.

As shown in FIG. 1B, the head 54 further includes an enclosed central gas channel 71 and a plurality of enclosed channels 72 that extend laterally from the channel 71, wherein the channel 71 and each of the channels 72 are interposed between the upper and lower walls 64 and 66 of the head 54. In particular, the channel 71 is adapted to extend from the gas channel 70 of the neck 52 so as to enable the gas 33 to flow from the neck 52 to the head 54. Furthermore, each of the channels 72 extends from the central channel 71 so as to allow the gas 33 to flow from channel 71 to each of the channels 72. Moreover, the head 54 is further comprised of the plurality of distributed gas outlet holes 74 that extend through the lower wall 66 from the channels 72 to the lower surface 55 of the head 54 so as to produce a gas flow 76 therefrom having a generally radial pattern outward over the wafer 60 as shown in FIG. 1A.

When the wand 50 is positioned above the wafer 60 having a flat upper surface 62 and a flat lower surface 64, the wafer 60 becomes engaged with the wand 50 in a substantially non-contacting manner as shown in FIG. 1A. In particular, the gas flow 76 urges air adjacent the upper surface 62 into a state of relative motion while the air adjacent the lower surface 64 remains largely unaffected. Thus, in accordance with Bernoulli's equation, the wafer 60 experiences an upward "lift" force.

The upward force causes the wafer 60 to be subsequently displaced to an equilibrium position, wherein the wafer 60 levitates below the head 54 without substantially contacting the head 54. In particular, at the equilibrium position, the downward reactive force acting on the wafer 60 caused by the gas flow 76 impinging the upper surface 62 of the wafer 60 and the gravitational force acting on the wafer 60 combine to offset the lift force. Consequently, the wafer 60 levitates below the head 54 at a substantially fixed position with respect to the head 54. Furthermore, while the wafer 60 is engaged by the head 54 in the foregoing manner, the plane of the wafer 60 is oriented so as to be substantially parallel to the plane of the head 54. Moreover, the distance between the upper surface 62 of the wafer 60 and the lower surface 55 of the head 54 is typically small in comparison with the diameter of the wafer 60.

To prevent the wafer 60 from moving in a horizontal manner, the gas flow 76 is adapted with a lateral bias which causes the wafer 60 to experience a lateral force that urges the wafer 60 to gently travel toward the feet 56 of the wand 50. Consequently, a non-sensitive side surface 66 of the wafer 60 subsequently engages with the feet 56 so as to prevent further lateral movement of the wafer 60 with respect to the wand 50.

With the Bernoulli wand 50 engaging the wafer 60 in the foregoing manner, movement of the wand 50 caused by the movement of the outer end 43 of the robotic arm 44 advantageously results in virtually contact-free movement of the wafer 60. Furthermore, since the neck 52, head 54, and feet 56 of the wand 50 are typically constructed of quartz, the wand 50 is able to extend into a high temperature chamber so as to manipulate the wafer 60 having a temperature as high as 970 degrees Celsius.

However, if the wafer 60 is transported by the wand 50 from a first environment having a high temperature, through a second environment having a significantly lower temperature, and into a third environment having a high temperature, it is possible that the wafer 60 will experience an abrupt change in temperature during the movement process. In particular, the wafer 60 emits thermal radiation at a rate that is proportional to the fourth power of the temperature of the wafer 60 and absorbs thermal radiation at a rate that is proportional to the fourth power of the temperature of the environment. If the initial temperature of the wafer 60 is greater than the temperature of the second environment, then the net rate of thermal radiation flowing away from the wafer will be large.

Furthermore, usually between wafer transfers, the wand will cool to a lower temperature rapidly in the cool environment. Thus, when a hot wafer is picked up by the cold wand, it will cool rapidly by convection and conduction.

To address the problem of decreasing wafer temperature, additional embodiments of the wafer transport system have been developed as shown in FIGS. 2A, 2B, 3, 4A, 4B, 4C, and 4D. In particular, each embodiment of the improved wafer transport system described herein below is comprised of a wafer transport assembly having a Bernoulli wand that is substantially similar to the wafer transport assembly 30 of FIGS. 1A and 1B so as to provide contact-free manipulation of the wafer 60. Additionally, each embodiment of the improved wafer transport system described hereinbelow is further comprised of a gas supply assembly that is substantially similar to the gas supply assembly 31 of FIGS. 1A and 1B. However, the improved wafer transport system described hereinbelow includes further adaptations that assist in regulating or controlling the temperature of the wafer 60 while the wafer 60 is transported between high temperature environments.

It will be appreciated that there are various ways of regulating the temperature of the wafer 60. For example, one method involves exposing the wafer 60 to a source of radiant heat. In particular, if a hot body is positioned adjacent the wafer 60, then a significant portion of the thermal radiation that is emitted by the hot body will be directed toward the wafer 60. Consequently, at a minimum, the net flow of thermal radiation emanating from the wafer 60 will be reduced.

Another method that could be used to regulate the temperature of the wafer 60 involves positioning a highly reflective body adjacent to the wafer 60. As a possible result, a significant portion of the thermal radiation emitted by the wafer 60 will be reflected back toward the wafer 60 and be reabsorbed by the wafer 60. Consequently, at a minimum, the wafer 60 will lose thermal energy at a reduced rate with the corresponding result that the temperature of the wafer 60 will decrease at a reduced rate.

Another method that could be used to regulate the temperature of the wafer 60 involves raising the temperature of the gas that flows adjacent the wafer 60. In particular, if the temperature of the gas is only moderately increased, then less thermal energy will escape from the wafer 60 through the convection process. Alternatively, if the temperature of the gas is increased beyond the current temperature of the wafer 60, then convective heating of the wafer 60 will occur.

Figure 2A:
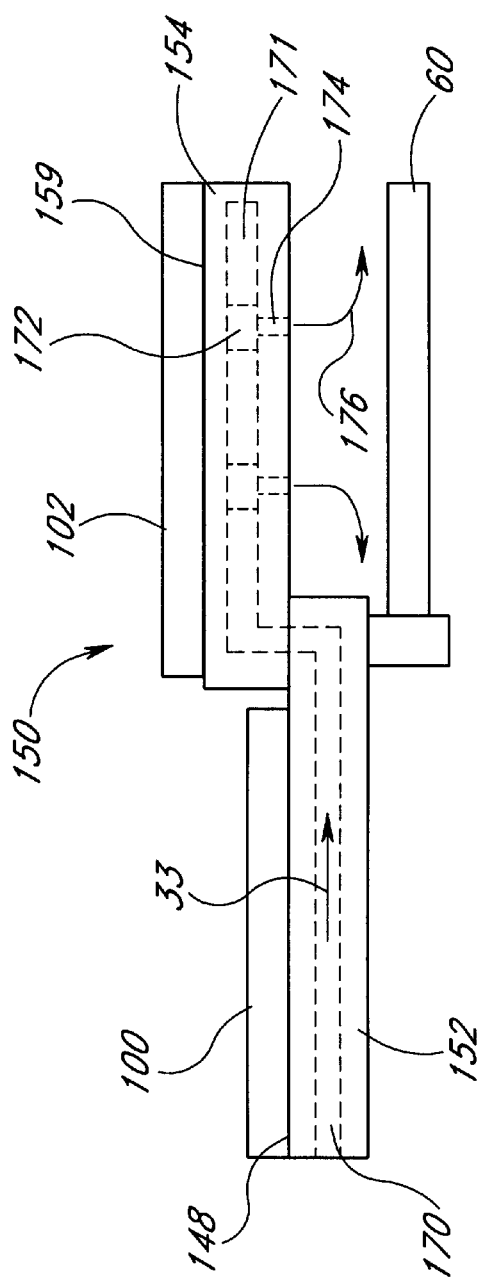
FIG. 2A is a schematic side view of an improved Bernoulli wand which includes a pair of attached heating elements.

Reference will now be made to FIG. 2A which illustrates an improved Bernoulli wand 150 that utilizes an active method of heating, wherein the wand 150 is adapted to replace the wand 50 of FIGS. 1A and 1B. In particular, the wand 150, being substantially similar to the wand 50 of FIGS. 1A and 1B, includes a neck 152 having an upper surface 148 and a head 154 having an upper surface 159, wherein the neck 152 and the head 154 are substantially similar to the neck 52 and head 54 of FIGS. 1A and 1B. Furthermore, the wand 150 is adapted to be supported by the robotic arm 44 in the manner of FIGS. 1A and 1B and is adapted to receive the flow of gas 33 in the manner of FIGS. 1A and 1B. Moreover, the wand 150 includes a gas channel 170 and a gas channel 171 that are substantially similar to the channels 70 and 71, respectively, of the wand 50. Additionally, the wand 150 includes a plurality of lateral gas channels 172 and a plurality of outlet holes 174 extending therefrom that are substantially similar to the gas channels 72 and outlet holes 74 of the wand 50 so as to produce a radial flow of gas 176 beneath the head 154 that is substantially similar to the flow 76 of FIGS. 1A and 1B.

However, as shown in FIG. 2A, the wand 150 is further comprised of a pair of heating pads 100 and 102 that are adapted to actively heat the wand 150. In particular, the heating pads 100 and 102 are well known electrically powered resistive heating devices that produce thermal energy. Furthermore, the heating pad 100 is flushly mounted to the upper surface 148 of the neck 152 so as to conduct heat from the heating pad 100 to the neck 152. Moreover, the heating pad 102 is flushly mounted to the upper surface 159 of the head 154 so as to conduct heat from the heating pad 102 to the head 154. Thus, the wand 150 can be configured so that it is provided thermal energy during the transportation process. Consequently, as the gas 33 travels through the heated neck 152 and heated head 154 of the wand 150, the temperature of the gas 33 will increase so as to increase the temperature of the gas 176.

In one embodiment, the heating pads 100 and 102 are capable of keeping the temperature of the wand 150, and the gas at about 600–800 degrees Celsius.

It will be appreciated that the wand 150 is more effective than the wand 50 of FIGS. 1A and 1B at regulating the temperature of the wafer 60. In particular, the increased temperature of the wand 150 results in the wafer 60 absorbing an increased amount of thermal radiation from the wand 150. Furthermore, the increased temperature of the gas flow 176 will, at a minimum, reduce the rate of convective heat loss experienced by the wafer 60. Moreover, if the temperature of the wand 150 is sufficiently increased, then the temperature of the wafer 60 can even be increased or held constant.

Figure 2B:
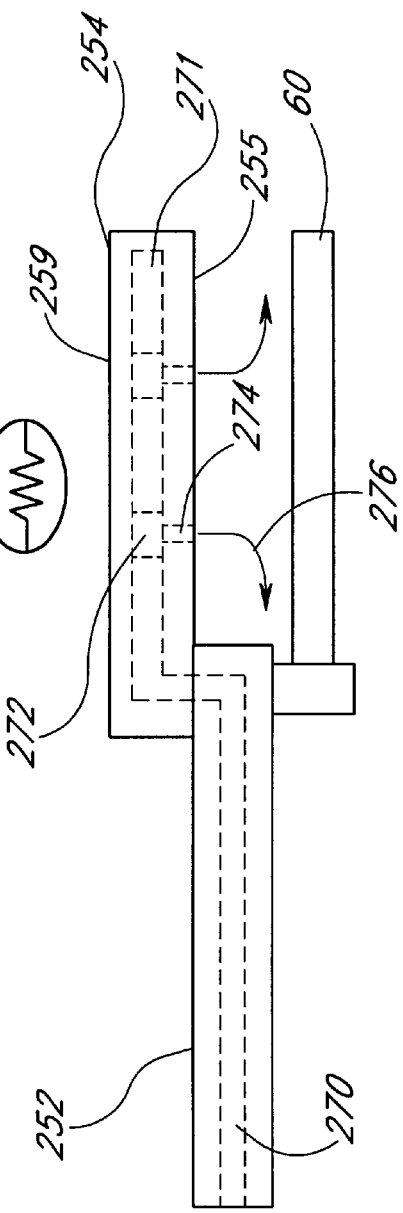
FIG. 2B is a schematic side view of an improved Bernoulli wand which includes radiant heat absorbing surfaces and an external source of thermal radiation.

Reference will now be made to FIG. 2B which illustrates an improved Bernoulli wand 250 that utilizes a passive method of heating, wherein the wand 250 is adapted to replace the wand 50 of FIGS. 1A and 1B. In particular, the wand 250 is substantially similar to the wand 50 of FIGS. 1A and 1B and it includes a neck 252 that is substantially similar to the neck 52 of FIGS. 1A and 1B and a head 254 that is similar in shape and size to the head 54 of FIGS. 1A and 1B. Moreover, the wand 250 includes a gas channel 270 and a gas channel 271 that are substantially similar to the channels 70 and 71, respectively, of the wand 50. Additionally, the wand 250 includes a plurality of lateral gas channels 272 and a plurality of outlet holes 274 extending therefrom that are substantially similar to the gas channels 72 and outlet holes 74 of the wand 50 so as to produce a radial flow of gas 276 beneath the head 254 that is substantially similar to the flow 76 of FIGS. 1A and 1B.

However, instead of being fabricated from quartz, the head 254 is either partially or totally constructed of a heat absorbent material, such as silicon carbide, that is able to withstand high temperatures in a rigid state and is also more absorbent to radiant heat. Thus, the head 254 is formed with upper and lower surfaces 259 and 255 having the heat absorbing characteristics that are more similar to those of a perfect absorber.

As shown in FIG. 2B, the wafer transport assembly 230 is further comprised of a radiative heating element or lamp 200. In particular, the heating element 200 is preferably positioned adjacent the upper surface 259 so as to optimally expose the upper surface 259 to thermal radiation emitted by the heating element 200. This can be a lamp used to heat the wafer or a separate one. Due to the heat absorbing nature of the upper surface 259 of the head 254, the thermal radiation that reaches the upper surface 259 is mostly absorbed by the head 254. Furthermore, due to the heat absorbing nature of the lower surface 255 of the head 254, much of the thermal radiation emitted by the wafer 60 will be absorbed by the head 254. Consequently, the increased absorption of radiant heat by the head 254 will, at a minimum, cause the temperature of the head 254 to decrease at a reduced rate. Furthermore, the increased absorption of radiant heat by the head 254 will result in the gas 276 emanating from the head 254 having an increased temperature.

As a result, the temperature of the wand 250 and the temperature of the gas in this embodiment is prevented from dropping below about 600–800 degrees Celsius.

It will be appreciated that the wand 250 is more effective than the wand 50 of FIGS. 1A and 1B at regulating the temperature of the wafer 60. In particular, the increased production of thermal radiation emitted by the head 254 of the wand 250 enables the wafer 60 to absorb a greater amount of radiant heat. Furthermore, the increased temperature of the gas flow 276 will, at a minimum, lower the rate of convective heat loss experienced by the wafer 60. Moreover, if the temperature of the wand 250 is sufficiently increased, then the temperature of the wafer 60 can even be increased or held constant.

Figure 3:
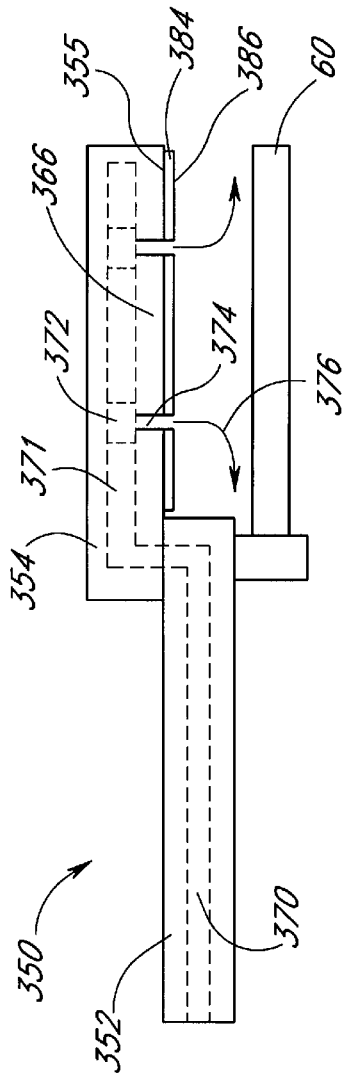
FIG. 3 is a schematic side view of an improved Bernoulli wand which includes a reflective lower surface.

Reference will now be made to FIG. 3 which illustrates an improved Bernoulli wand 350 that utilizes a reflective surface 386 to reduce the rate of cooling of the engaged wafer 60, wherein the wand 350 is adapted to replace the wand 50 of FIGS. 1A and 1B. In particular, the wand 350, being substantially similar to the wand 350 of FIGS. 1A and 1B, includes a neck 352 having a channel 370 that is similar to the neck 52 of FIGS. 1A and 1B and a head 354 that is adapted with the exposed reflective surface 386 which enables a greater amount of radiant heat to be reflected back to the wafer 60. Specifically, a thin layer 384 of reflective material, such as gold, nickel or aluminum, having the exposed reflecting surface 386 is adhered to a lower surface 355 of the head 354 so as to substantially cover the lower surface 355. Furthermore, the head 354, being similar to the head 54, is comprised of an enclosed central gas channel 371 and a plurality of laterally directed gas channels 372 that are substantially similar to the gas channel 71 and gas channels 72 of FIGS. 1A and 1B respectively. Moreover, the head 354 is comprised of a plurality of outlet holes 374 that extend through a lower wall 366 of the head 354 from the gas channels 372 to the exposed surface 386 so as to produce a gas flow 376 that is substantially similar to the gas flow 76 of FIGS. 1A and 1B.

It will be appreciated that the wand 350 is more effective than the wand 50 of FIGS. 1A and 1B at regulating the temperature of the wafer 60. In particular, since the reflectivity of the surface 386 of the head 354 is larger than the reflectivity of the lower surface 55 of the head 54 of FIGS. 1A and 1B, a larger amount of radiant heat will be reflected back towards the wafer 60 by the surface 386. Consequently, the net flow of thermal radiation emanating from the wafer 60 will be reduced.

Reference will now be made to FIGS. 4A through 4D, which illustrate various gas heating devices 400, 500, and 600 that operate in conjunction with the wafer transport assembly 30 of FIGS. 1 through 3. In particular, the gas heating devices 400, 500, and 600 are adapted to raise the temperature of the gas 33 that enters the wand 50 so as to produce the flow of gas 76 having an increased temperature so that, at a minimum, the rate of convective cooling of the wafer 60 is reduced. As an added benefit, the increased temperature of the gas 33 will also raise the temperature of the wand 50, thereby further exposing the wafer to increased levels of radiant heat.

Figure 4A:
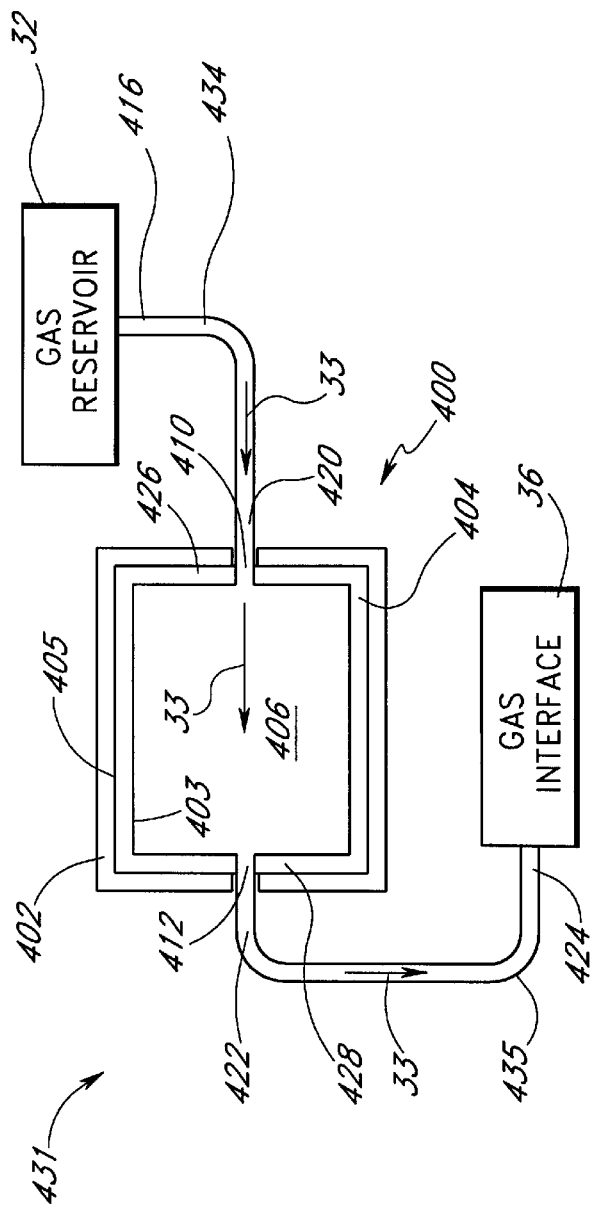
FIG. 4A is a schematic side view of an improved gas supply assembly that is adapted to better regulate the temperature of the wafer of FIG. 1.

FIG. 4A illustrates a gas supply assembly 431 comprised of a gas heating device 400, wherein the assembly 431 is adapted to replace the gas supply assembly 31 of FIGS. 1A and 1B. In particular, the heating device 400 increases the temperature of the gas 33 that flows from the assembly 431. Specifically, the device 400 is comprised of a heat conducting housing 404 having an interior surface 403 and an exterior surface 405, an enclosed cavity 406 formed inside the housing 404, a gas inlet 410 that extends from the cavity 406 at a first end 426 of the housing 404, a gas outlet 412 that extends from the cavity 406 at a second end 428 of the housing 404, and a heater jacket 402 that flushly surrounds the exterior surface 405 of the housing 404 so as to supply the device 400 with a source of thermal energy. Furthermore, the assembly 431 is additionally comprised of the main gas reservoir 32 of FIGS. 1A and 1B, a primary gas hose 434 having first and second ends 416 and 420, respectively, and a secondary gas hose 435 having first and second ends 422 and 424 respectively.

As shown in FIG. 4A, the reservoir 32 communicates with the heating device 400 through the primary hose 434 so as to enable the gas 33 to flow from the reservoir 32 to the cavity 406 and be heated therein. In particular, the first end 416 of the hose 434 is attached to an outlet of the reservoir 32 and the second end 420 of the hose 434 is attached to the inlet 410 of the heating device 400. Furthermore, heat that is generated by the heater jacket 402 conducts through the housing 404 and is absorbed by the gas 33 flowing through the cavity 406. Consequently, the temperature of the gas 33 is increased as the gas 33 travels through the heating device 400.

As shown in FIG. 4A, the heating device 400 communicates with the wafer transport assembly 30 through the secondary hose 435 so as to allow the gas 33 to flow from the cavity 406 to the wafer transport assembly 30 in a heated state. In particular, the first end 422 of the hose 435 is attached to the outlet 412 of the heating element 400 and the second end 424 of the hose 435 is attached to the gas interface 36 of the wafer transport assembly 30. Moreover, the hose 435 is preferably formed of heat insulating material so as to maintain the temperature of the gas 33 as the gas 33 travels along the hose 435.

Figure 4B:
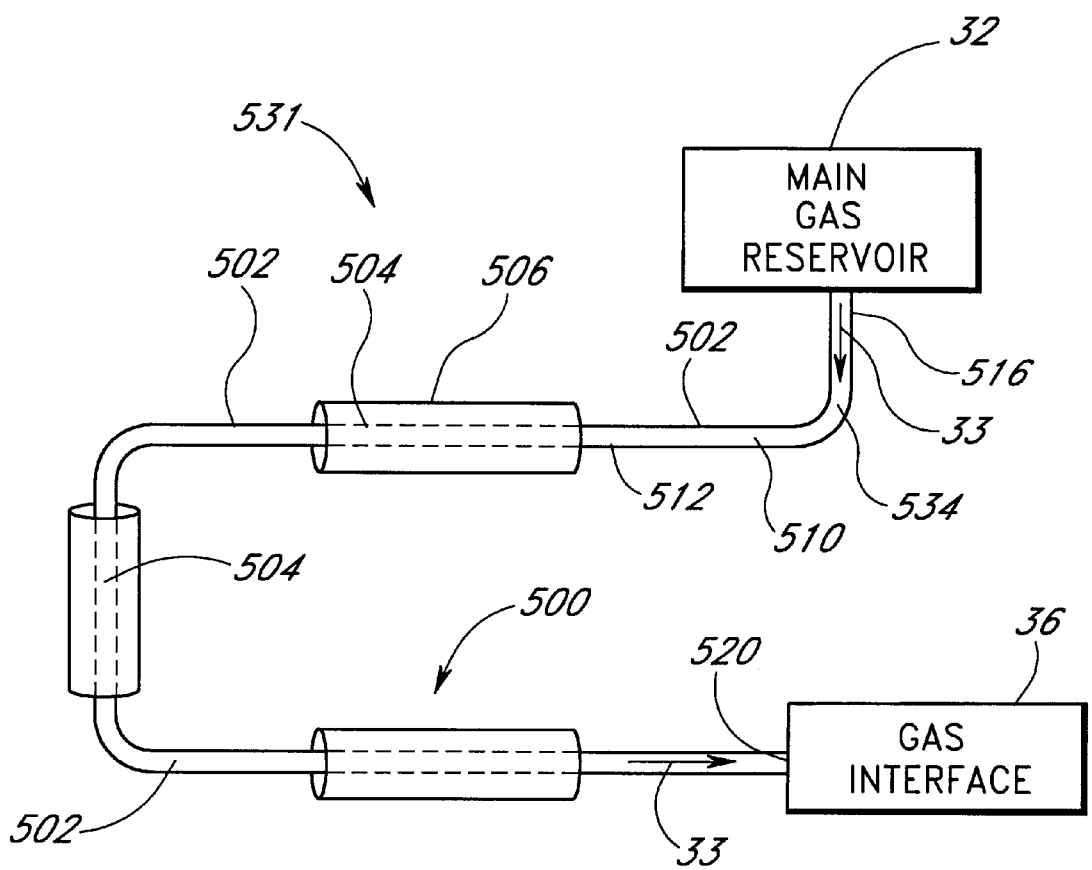
FIG. 4B is a schematic side view of an improved gas supply assembly that is adapted to better regulate the temperature of the wafer of FIG. 1.

FIG. 4B illustrates a gas supply assembly 531 comprised of a gas heating device 500 that extends from the gas reservoir 32, wherein the assembly 531 is adapted to replace the gas supply assembly 31 of FIGS. 1A and 1B. In particular, the gas heating device 500 is comprised of a flexible main gas hose 534 having a pair of first and second ends 516 and 520, respectively, and at least one heater jacket 506. Furthermore, the hose 534 is comprised of a cylindrical wall 512 that surrounds an elongated channel 510, wherein the channel 510 extends between the first and second ends 516 and 520 respectively. Moreover, the wall 512 is comprised of a plurality of heat insulating sections 502 and at least one heat conducting section 504 that is interposed between the sections 502. Additionally, each jacket 506 is adapted to flushly surround the corresponding heat conducting section 504 so as to allow heat from the jacket 506 to conduct into the channel 510.

As shown in FIG. 4B, the first end 516 of the hose 534 is attached to the reservoir 32 so as to allow the gas 33 from the reservoir to travel along the channel 510 of the hose 534. As the gas 33 travels along the channel 510, heat that is conducted from the jacket 506 through the section 504 is absorbed by the gas 33. Consequently, when the gas 33 travels to the second end 520 of the hose 534, the temperature of the gas 33 will be increased. Furthermore, the second end 520 of the hose 534 is attached to the gas interface 36 so as to allow the heated gas 33 to flow through the wafer transport assembly 30 in the manner of FIGS. 1A and 1B.

Figure 4C:
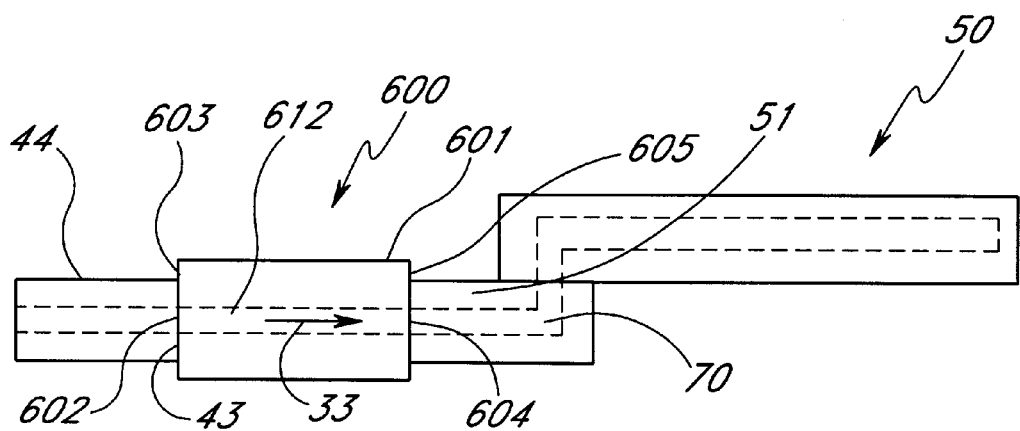
FIG. 4C is a schematic side view of a gas heating device that is adapted to be interposed between a robotic arm of FIG. 1 and the Bernoulli wand of FIG. 1.
Figure 4D:
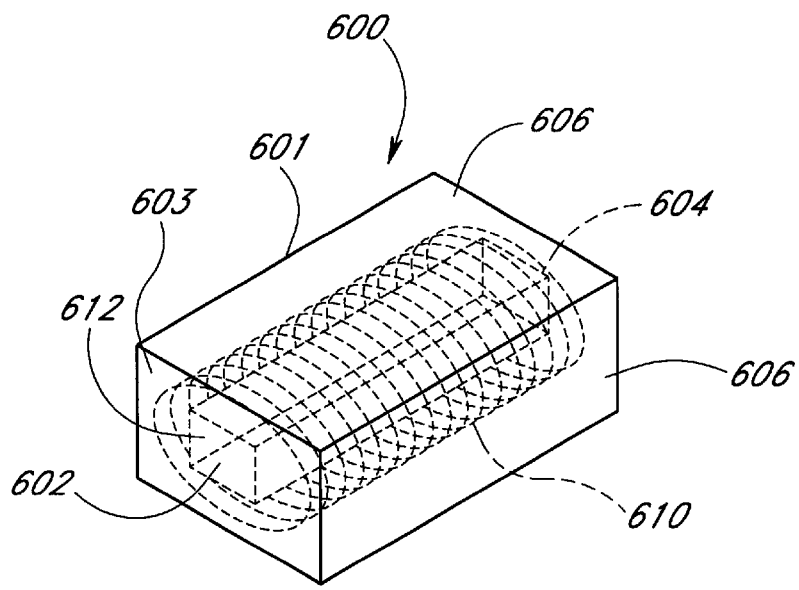
FIG. 4D is a perspective view the gas heating device of FIG. 4C.

FIGS. 4C and 4D illustrate the gas heating device 600 that is adapted for use in the wafer transport assembly 30 of FIGS. 1A and 1B. As will be described in greater detail below, the device 600 is interposed between the robotic arm 44 and the wand 50 so as to heat the gas 33 that flows from the robotic arm 44 to the wand 50.

As shown in FIGS. 4C and 4D, the device 600 is comprised of a sleeve 601 having one or more substantially solid interconnecting outer walls 606 so as to form an enclosed channel 612 that extends from a first opening 602 to a second opening 604. The sleeve 601 further includes a first end 603 adjacent the first opening 602 that is adapted to couple with the outer end 43 of the robotic arm 44 so as to support the sleeve 601 and so as to enable the gas 33 to flow from the channel 42 of the robotic arm 44 through the first opening 602 into the channel 612. The sleeve 601 further includes a second end 605 adjacent the second opening 604 that is adapted to couple with the first end 51 of the neck 52 of the wand 50 so as to support the wand 50 in a preferred orientation and so as to enable the gas 33 to flow from the second opening 604 into the channel 70 of the neck 52.

As shown in FIG. 4D, the device 600 is further comprised of a plurality of heater cartridges 610 that are adapted to generate thermal energy so as to provide a source of heat. In particular, the cartridges 610 are embedded in the walls 606 of the sleeve 601 so that the heat generated by the cartridges 610 will conduct through the walls 606 to the channel 612 formed therein. Furthermore, the gas 33 traveling through the channel 612 will absorb the heat provided by the cartridges 610, thus causing the temperature of the gas 33 to increase. Consequently, upon entering the wand 50, the temperature of the gas 33 will be increased.

Although the illustrated embodiment of the device 600 of FIG. 4C is comprised of the walls 606 having a rectangular cross section, it will be understood by one of ordinary skill in the art that the walls 606 can form a number of alternative shapes. For example the walls 606 could take the form of a single cylindrical wall having a cylindrical channel formed therein.

In one embodiment, the heating device 400, 500 or 600 is adapted to raise the temperature of the gas 33 from an initial temperature of 20 degrees Celsius to a final temperature of >400 degrees Celsius. Furthermore, in this embodiment, the device 400 is able to accommodate a flow rate of nitrogen gas as high as 100 liters per minute.

If the wafer transport system 29 of FIG. 1 is adapted with either of the heating devices 400, 500, and 600 as described above, it will be appreciated that the wafer transport system 29 will be more effective at regulating the temperature of the wafer 60. In particular, the increased temperature of the gas 76 emanating from the wand 50 will, at a minimum, reduce the rate of convective cooling experienced by the wafer 60. Furthermore, the increased temperature of the gas 33 will, at a minimum, increase the emission of thermal radiation from the wand 50 and consequently the absorption of radiant heat by the wafer 60. Moreover, if the temperature of the gas 76 is sufficiently increased, then the temperature of the wafer 60 can either be increased or held constant.

It will therefore be appreciated that the improvements described above enables the wafer 60 to be repositioned in a more effective manner. In particular, the temperature of the wafer 60 can be held constant or even increased so as to reduce wafer deformation and thermal shock when the wafer 60 is placed into a hot reactor or onto a hot body. Furthermore, if the wafer 60 is placed on a hot body, such as a susceptor, the susceptor will experience less thermal shock, thereby improving the performance of the susceptor. Moreover, since the improvements described above enable the wafer 60 to retain its thermal energy during the movement process, less time is required to raise the temperature of the wafer 60 to the preferred processing temperature.

Figure 5:
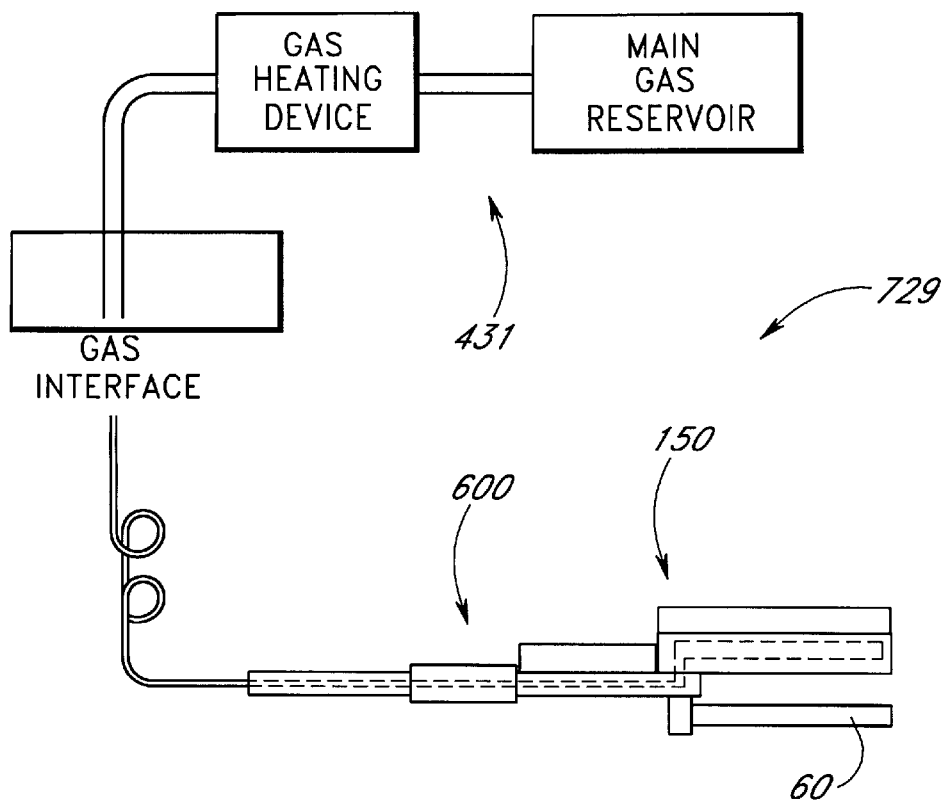
FIG. 5 schematically illustrates a wafer transport system comprised of the Bernoulli wand of FIG. 2A, the gas supply assembly of FIG. 4A and the gas heating device of FIGS. 4C and 4D.

It will also be appreciated that each embodiment described above can be used jointly with the other embodiments so as to create a new embodiment that is more effective at regulating the temperature of the wafer 60. For example, FIG. 5 illustrates a semiconductor wafer transport system 729 that is substantially similar to the semiconductor wafer transport system 29 of FIG. 1A. However, the system 729 includes the gas supply assembly 431 of FIG. 4A, the heated wand 150 of FIG. 2A, and the gas heating device 600 of FIGS. 4C and 4D.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. For example, while the invention is illustrated in connection with a Bernoulli wand, other non-contacting gas techniques may be employed for lifting a wafer, such as gas flow from below a wafer. Consequently, the scope of the invention should not be limited to the foregoing description, but should be defined by the appended claims.

What is claimed is:

1. A semiconductor wafer handler comprising:
a wand having a rear portion adapted to be connected to a robotic arm and a forward portion configured to be positioned adjacent a wafer, the forward portion having one or more gas outlets arranged to direct gas flow against the wafer in a manner to support the wafer in a substantially non-contact manner; and
a heater mounted on said wand rear portion.

2. The handler of claim 1, including a heater mounted on said wand forward portion.

3. The handler of claim 1, including a reflective surface on said wand forward portion which is positioned to reflect back to the wafer energy radiating from the wafer.

4. The handler of claim 1, wherein said wand forward portion includes material which is a good absorber of radiant heat and absorbs heat during the processing of a wafer in a hot chamber so that the material may provide heat to the wafer as it is being moved.

5. The handler of claim 4, wherein said rear portion includes material which is a good absorber of radiant heat.

6. A semiconductor wafer handler comprising:
a wand having a rear portion adapted to be connected to a robotic arm and a forward portion configured to be positioned adjacent a wafer, the forward portion having one or more gas outlets arranged to direct gas flow against the wafer in a manner to support the wafer in a substantially non-contact manner; and
said wand including one or more gas passages for ducting gas from a gas source to said gas outlets, and one or more heaters mounted on the wand in position to heat gas flowing through said passages.

7. The handler of claim 6, wherein said wand forward portion includes an upper wall configured to extend over the wafer, and said gas outlets are arranged to direct gas onto the upper surface of the wafer and flow outwardly to the periphery of the wafer to create a pressure above the wafer which is less than the pressure below the wafer to thereby lift the wafer employing the Bernoulli principle.

8. The handler of claim 7, wherein said one or more heaters comprise a heating device connected to said upper wall.

9. A semiconductor wafer handler comprising:
a wand having a rear portion adapted to be connected to a robotic arm and a forward portion configured to be positioned adjacent a wafer, the forward portion having one or more gas outlets arranged to direct gas flow against the wafer in a manner to support the wafer in a substantially non-contact manner, said wand forward portion including an upper wall configured to extend over the wafer, and said gas outlets being arranged to direct gas onto the upper surface of the wafer and flow outwardly to the periphery of the wafer to create a pressure above the wafer which is less than the pressure below the wafer to thereby lift the wafer employing the Bernoulli principle;
a heating device connected to said upper wall; and
a heating device connected to said wand rear portion.

10. The handler of claim 9, including a reflective surface carried by said wand and positioned to be spaced beneath the wafer when the wafer is supported from above by the gas flow, the reflective surface being adapted to reflect energy radiating from the wafer back onto the wafer.

11. A semiconductor wafer transport system for transferring a hot wafer from a hot chamber to another chamber while minimizing or maintaining heat loss from the wafer during the transfer, comprising:
a wand adapted to be connected to a gas supply and configured to produce a flow of gas along an upper surface of a wafer so as to produce a pressure differential between the upper surface of the wafer and a lower surface of the wafer which generates a lift force that supports the wafer below the wand in a substantially non-contacting manner, said wand includes a portion formed of quartz or a nonmetallic, heat-absorbing material that is able to withstand the high temperatures of said hot chamber; and
at least one thermal energy source that affects the temperature of the wafer while the wafer is suspended beneath the wand, so that the wafer temperature is maintained at least above 400° C. during said transfer.

12. The system of claim 11, wherein the energy source includes at least one resistive heater that is connected to the wand.

13. The system of claim 11, wherein said portion is silicon carbide which will inhibit the wafer from losing thermal energy.

14. The system of claim 11, including a reflective layer of material on said wand positioned adjacent the suspended wafer in a manner such that a significant portion of thermal radiation emitted by the wafer will be reflected back towards the wafer so as to inhibit the wafer from losing thermal energy.

15. A semiconductor wafer transport system comprising:

a wand adapted to be connected to a gas supply and configured to produce a flow of gas along an upper surface of a wafer so as to produce a pressure differential between the upper surface of the wafer and a lower surface of the wafer which generates a lift force that supports the wafer below the wand in a substantially non-contacting manner; and at least one thermal energy source that affects the temperature of the wafer while the wafer is suspended beneath the wand, said energy source including a gas heating device arranged to raise the temperature of the gas that is supplied from the gas supply so as to decrease lost thermal energy from the wafer.

16. The system of claim 15, wherein the energy source includes a heat conducting housing and at least one heater jacket that surrounds the housing, the housing being configured to be positioned adjacent a conduit ducting gas from said supply to said wand.

* * * * *